United States Patent [19]

Knapp et al.

[11] Patent Number: 5,574,655

[45] Date of Patent: Nov. 12, 1996

[54] METHOD OF ALLOCATING LOGIC USING GENERAL FUNCTION COMPONENTS

[75] Inventors: Steven K. Knapp, Santa Clara; Jorge P. Seidel, San Jose, both of Calif.

[73] Assignee: Xilinx, Inc., San Jose, Calif.

[21] Appl. No.: 441,237

[22] Filed: May 15, 1995

Related U.S. Application Data

[63] Continuation of Ser. No. 223,374, Apr. 5, 1994, abandoned, which is a continuation of Ser. No. 785,121, Oct. 30, 1991, abandoned.

[51] Int. Cl.$^6$ ........................................... G06F 15/60
[52] U.S. Cl. ................................. 364/489; 364/578
[58] Field of Search ............................ 364/488, 489, 364/490, 491, 578

[56] References Cited

U.S. PATENT DOCUMENTS

| | | | |
|---|---|---|---|
| 4,656,592 | 4/1987 | Spaanenburg et al. | 364/490 |
| 4,703,435 | 10/1987 | Darringer et al. | 364/489 |
| 4,803,636 | 2/1989 | Nishiyama et al. | 364/491 |
| 4,922,432 | 5/1990 | Kobayashi et al. | 364/490 |
| 5,164,907 | 11/1992 | Yabe | 364/491 |

*Primary Examiner*—Kevin A. Kriess
*Attorney, Agent, or Firm*—Edel M. Young; Jeanette S. Harms

[57] ABSTRACT

A method is described for configuring a general symbol to represent a specific symbol indicated by a user. The specific symbols are part of a library. A general symbol for which optimized implementations have been determined and stored is configured to implement the specific function specified by a user. Implementations provided for the general symbol include special functions which provide both high speed and small chip area.

38 Claims, 8 Drawing Sheets

FPGA Block Diagram
(entered into system)

↓ Architecture Specific Logic Synthesis

Xilinx FPGA Implementation

GENERAL ARITHMETIC FUNCTION

Fig. 9

PIN MAPPING OUT ARITH FUNCTION

| ARITH FUNCTION | COUNTER | ADD-SUB. | ACCUM | COMPARE | REGISTER | 3STATE |
|---|---|---|---|---|---|---|
| OUT-ENA | | | | | | OE |
| ADD-SUB | UP_DN | ADD_SUB | ADD_SUB | 'LOW' | | |
| CARRY-IN | | CARRY-IN | CARRY-IN | | | |
| A | '1' | A | A | A | | |
| B | COUNT | B | SUM | B | | |
| LOAD | LOAD | | LOAD | | | |
| SET | SET | | SET | | SET | |
| RESET | RESET | | RESET | | RESET | |
| CLOCK | CLOCK | | CLOCK | | CLOCK | |
| SUM | (1) | SUM | (1) | (1) | DATA | (3) |
| OUT | | | | | | ( ) |
| Q-SUM | COUNT | | SUM | | | (3) |
| CARRY-OUT | TERM-CNT | CARRY-OUT | CARRY-OUT | (2) | | |
| OVERFLOW | | OVERFLOW | OVERFLOW | (2) | | |
| MATH= | SEQUENCE= | MATH= | MATH= | MATH= | | |
| SET= | SET= | | SET= | | SET= | |
| RESET= | RESET= | | RESET= | | RESET= | |
| CLK-ENA | CLK-ENA | | CLK-ENA | | CLK-ENA | |

METHOD OF ALLOCATING LOGIC USING GENERAL FUNCTION COMPONENTS

This application is a continuation of application Ser. No. 08/223,374, filed Apr. 5, 1994 which is a continuation of application Ser. No. 07/785,121, filed Oct. 30, 1991, both abandoned.

FIELD OF THE INVENTION

The invention relates to computer aided engineering, more particularly to developing optimum implementation of high level functions in a user programmable logic array chip.

RELATED APPLICATIONS

The present invention relates to inventions described in the following copending (concurrently filed) patent applications:

1. Steven H. Kelem and Steven K. Knapp, METHOD FOR PROPAGATING DATA TYPE IN A HIGH LEVEL CIRCUIT DESIGN, U.S. patent appliction Ser. No. 07/785,664 now U.S. Pat. No. 5,422,833.
2. Jorge P. Seidel and Arun K. Mandhania, METHOD FOR IMPLEMENTING SET/RESET SYNCHRONOUSLY OR ASYNCHRONOUSLY IN A PROGRAMMABLE LOGIC DEVICE. U.S. patent application Ser. No. 07/787,343 now U.S. Pat. No. 5,337,255.
3. Jorge P. Seidel, Steven K. Knapp, Steven H. Kelem, METHOD FOR GENERATING LOGIC MODULES FROM A HIGH LEVEL BLOCK DIAGRAM, U.S. patent application Ser. No. 08/268,884, now U.S. Pat. No. 5,499,192.
4. Jorge P. Seidel and Steven K. Knapp, METHOD FOR OPTIMIZING RESOURCE ALLOCATION STARTING FROM A HIGH LEVEL BLOCK DIAGRAM, U.S. patent application Ser. No. 07/784,842.

The above applications are incorporated herein by reference.

BACKGROUND OF THE INVENTION

Users typically design logic circuits using a computer with a schematic capture computer program or a hardware description language (HDL). The program allows the user to place symbols onto a computer screen and interconnect the symbols to indicate a circuit diagram, or to describe circuits and connections using textual description. The computer then captures the schematic diagram or logic design. Schematic capture and HDL entry are processes of converting a schematic drawing or text file generated by a user into a format which can be processed by a computer. Schematic capture and HDL software packages make it possible for a user to communicate the design to a computer conveniently. A schematic capture package typically converts the interconnected set of functional components to a net list (list of components and interconnections between these components) which can be further manipulated by other computer programs to perform a function desired by the user.

Typical schematic capture packages have included a library of primitive components, such as Boolean AND, XOR, flipflop, etc., which the user may place onto a computer display and interconnect with lines to form a logic design. However, users frequently think in terms of high-level functions to be performed, for example, counters, adders, registers and multiplexers. Entering a design directly in terms of the higher level logic operations the user intends to perform is more convenient and intuitive for a user than entering the logic design in terms of primitive AND, flipflop gates, etc.

Designing with Bus-Wide Functions

Users frequently design with bus-wide functions. For example, when a user manipulates a 10-digit number, the digits of the number are placed on a bus and are processed (added, compared, stored) as multi-bit numbers. In the past, the user may have been required to perform repetitive operations to generate the logic for processing the multiple bits. If the precision of the arithmetic to be performed changes, the user must then redesign a circuit to change-the width of the bus. Such activities become tedious and time-consuming for the user. It is desirable to perform repetitive operations automatically.

Certain high level arithmetic functional components such as adder, register, and counter are frequently used. Also used are high level register functions such as data registers, parallel-in serial-out shift registers, serial-in parallel-out shift registers, and left-right shift registers. Related patent application Ser. No. 08/268,884, filed concurrently with the present application, now U.S. Pat. No. 5,499,192 entitled METHOD FOR GENERATING LOGIC MODULES FROM A HIGH LEVEL BLOCK DIAGRAM, U.S. Pat. No. 5,499,192 describes a method for implementing certain high-level functional components directly input by a user in a logic array chip without involving the user in the intermediate step of generating primitive functional components.

Resource Allocation

The eventual placement of the elements of a logic design into a chip which will implement the design depends upon the resources provided in the chip and the distribution of these resources. For efficiency it is important that the resources of the chip be considered in allocating logic of the design into the chip, so that the logic functions can be computed at high speed, the area needed can be minimized, and the greatest amount of logic can be packed into a chip of a given size. Such resource allocation is discussed more thoroughly in copending U.S. patent application Ser. No. 07/784,842, which has been incorporated herein by reference.

Use With Xilinx-4000 Architecture

Xilinx XC4000-series field programmable gate array chips offer several resources intended for special purposes:

primary clock buffers, each of which feeds a line which extends throughout the chip but connects only to clock inputs of flip flops in the chip, secondary buffers, which feed a line extending through the chip but can be connected to inputs of the user's choice global three-state buffers, several of which connect to a single long line extending through the chip, arithmetic fast carry circuitry, which is hardwired to generate a carry output and which can be easily connected to carry input ports on adjacent cells, and input/output buffers which include a flip flop, and which can be connected to external pads.

For each of these resources it is necessary to evaluate the user's logic design and place logic such that the above resources are efficiently used.

FIG. 5 shows a portion of a Xilinx 4000-series field programmable logic array chip which can be advantageously programmed using the methods of the invention. Such chips are further described in the Xilinx Technical Data book entitled XC 4000 Logic Cell™ Array Family. © 1990 by Xilinx, Inc., and available from Xilinx, Inc. 2100 Logic Drive, San Jose, 95124, and incorporated herein by reference. These XC4000-series chips include logic blocks in the interior of the chip each of which include both combinatorial and sequential elements, and which include a fast carry circuit for implementing arithmetic functions in adjacent logic blocks. The chip includes interconnect lines of both short and long length, short for interconnecting nearby elements, and long for interconnecting elements in distant parts of the chip or for interconnecting multiple elements.

SUMMARY OF THE INVENTION

According to the present invention, a method is provided for allocating logic to portions of a chip which can implement that logic most efficiently. Two examples of a general method are described here: specific arithmetic functions mapped to a general ARITH symbol, and register functions mapped to a general SHIFT symbol. In the ARITH example, the method uses the fast carry circuitry of the XC4000-series when this is the most advantageous method of performing arithmetic. Methods are provided by which carry and other arithmetic resources of the chip can be accounted for in algorithms which assign logic to the chip. Arithmetic aspects of the user's logic are checked for compatibility with the special resources. When a match is found, an attribute is attached to that logic element in the user's design. Then when the element is encountered during the partitioning, placement, and routing steps to follow, the attribute causes the partitioning and placement algorithms to place the logic where it is most efficiently implemented.

In the register example, the method uses the set/reset control method outlined in copending U.S. patent application Ser. No. 07/787,343, now U.S. Pat. No. 5,337,255, incorporated herein by reference, along with the global reset circuitry of the SC4000-series when the special purpose global set/reset buffer and line are the most efficient method of performing a global asynchronous reset of the register.

Methods are provided for parallel loading of data using a LOAD signal, left-right shift and synchronous control logic and incorporating all of the necessary logic that feeds the inputs of the individual flip flops that comprise register. Additionally the asynchronous logic is implemented by configuring the flip flops with the proper start-up value.

BRIEF DESCRIPTION OF THE DRAWINGS

FIG. 9 is a table showing the relationship between the general arithmetic function and the specific functions it implements.

DETAILED DESCRIPTION OF A PREFERRED EMBODIMENT

The resource allocation method of the present invention allows a user to design functions with high-level logic functional blocks and implement the design in field programmable gate array chips.

Figure 1B:
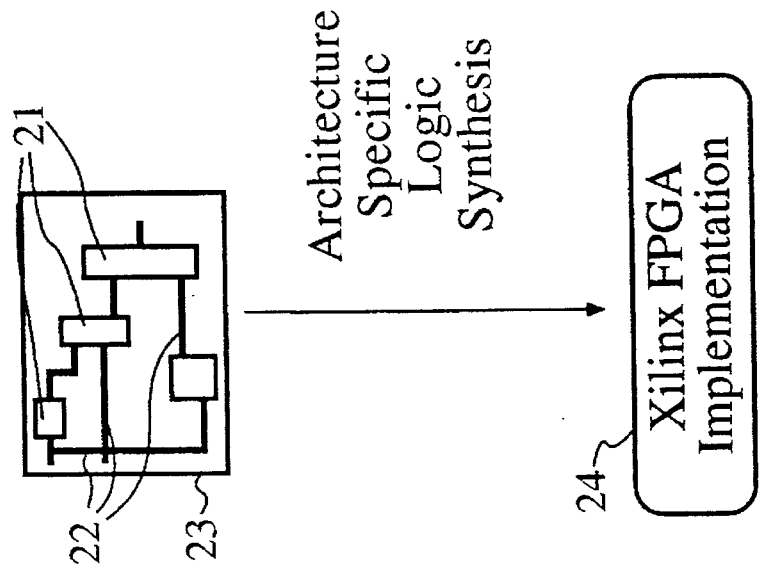
FIG. 1b represents the simplified process available with the present invention.
Figure 1A:
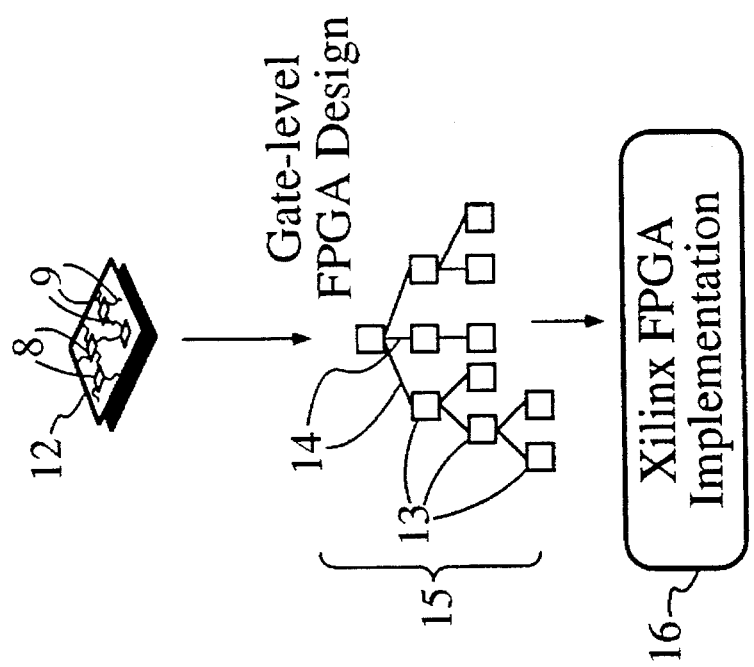
FIG. 1a represents a prior art method of designing.

FIG. 1a represents a prior art method of designing, in which the user made a drawing on paper 12 of a block diagram of a logic design, typically showing functional blocks 8 and interconnect lines 9. The user would then used a computer with CAE (computer aided engineering) software to represent the design 15 in terms of logic gates 13 and interconnect lines 14. Finally, this logic gate design 15, which had been laboriously generated, was converted to a programmed part 16, for example a Xilinx FPGA.

FIG. 1b represents the simplified process available with the present invention. A designer enters a block diagram 23 using a schematic editor such as FutureNet™, Cadence™, VIEWlogic™, OrCAD™, Mentor™ or another. A schematic editor allows the designer to represent the logic design as a schematic diagram using symbols on a computer monitor screen, and to draw lines on the computer screen between functional components to indicate the interconnections. The same can be done with hardware description languages. The present invention adds high-level symbols to a library available through the schematic editors. Automatically, the software of the present invention determines from the user's high-level block diagram or description 23 the equivalent cells in a field programmable gate array chip needed to implement the design. The user is relieved from having to perform the tedious step 15 of generating a gate-level design. Further, the translation of each functional block 21 can be optimized for the architecture and the optimized translation implemented in response to the user's designation of the functional block.

FIGS. 2a–2f show a set of graphical functional blocks in a library available to a user for entering arithmetic functions into a high-level block diagram. Hardware description blocks, not shown, can also be provided. The library associated with the method of the invention preferably includes other high level blocks as well as a complete set of Boolean functions and flip flops. These functional blocks are further discussed in U.S. patent application Ser. No. 08/268,884 now U.S. Pat. No. 5,499,192, incorporated herein by reference.

Figure 2A:
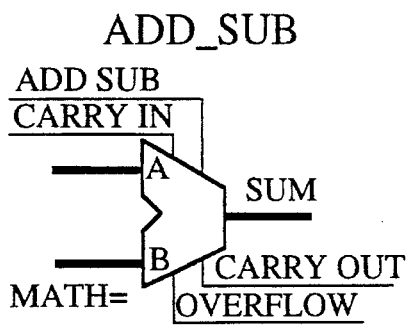
FIGS. 2a–2f show block symbols which can be used to enter arithmetic functions into a user's logic design.
Figure 2B:
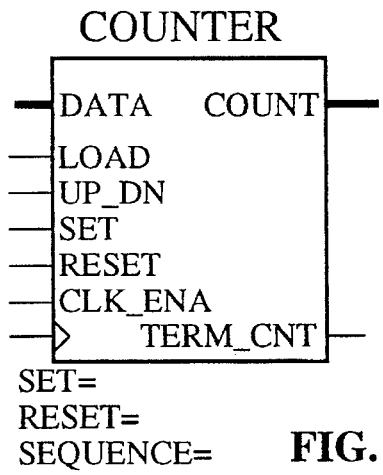
Figure 2C:
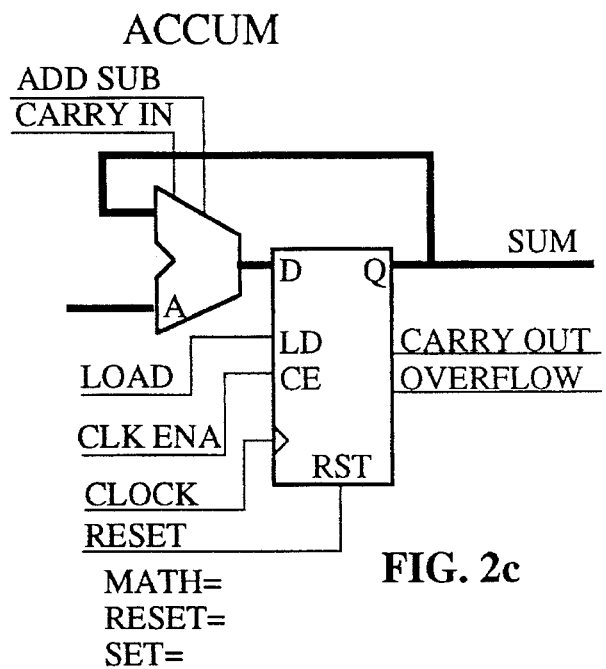
Figure 2D:
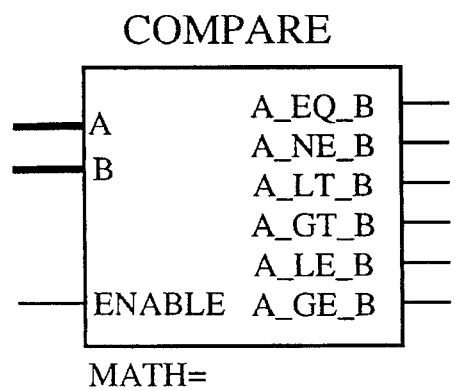
Figure 2E:
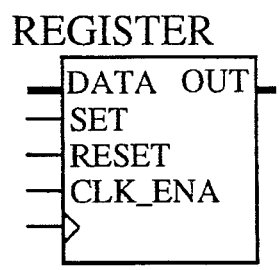
Figure 2F:
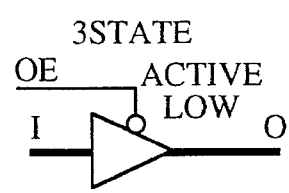

FIG. 2a shows a symbol for an ADD_SUB block which can be called to indicate an addition or subtraction function in a block diagram. FIG. 2b is a counter symbol, which can specify up and down counters, preload counters, and other counter variants. FIG. 2c shows an ACCUM accumulator symbol which can be inserted to specify adding, subtracting, and dynamically switched adding/subtracting. FIG. 2d shows a COMPARE comparator symbol which can indicate several types of comparison including less-than, equal, less-than-or-equal, and other variants. Comparators can be considered arithmetic functions since the output can be determined by subtracting one value from another and monitoring the carry output or overflow output depending on the data encoding method used. FIG. 2e shows a register (a bank of flip flops ordered and interconnected), and FIG. 2f shows a 3-STATE symbol for enabling a bus. FIGS. 2a–2f are from the Xilinx symbol library named BLOX. Other representations of these functions, both graphical and textual are possible. Textual versions can be found in hardware description languages (HDLs).

Figure 7A:
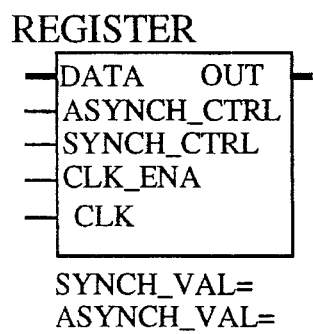
FIG. 7 shows a set of high level register symbols.
Figure 7B:
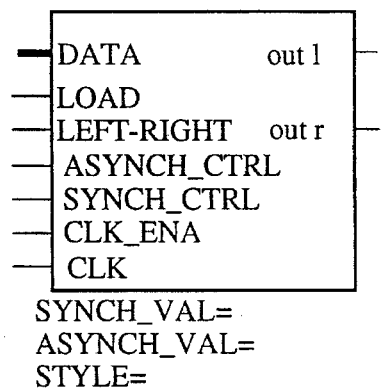
Figure 7C:
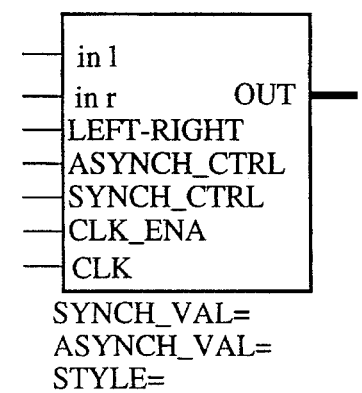
Figure 7D:
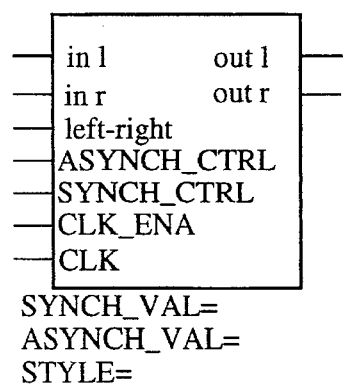

FIG. 7a shows a data register used to temporarily store a bus-wide data value. FIG. 7b is a parallel-load serial-out shift register. FIG. 7c is a serial-in parallel-out shift reigster. FIG. 7d is a serial-in serial-out left-right shift register. All of these symbols have asynchronous control (which defaults to a power-on reset) and can potentially have synchronous control. In addition to other representations of the two examples, other general symbols for combining other classes of specific functions both graphical and textual are possible.

The present invention includes method and means for recognizing each of these symbols and substituting logic gates for each of the symbols in accordance with parameters which a user attaches to the symbols. The method results in configuring a logic array chip to implement a logic design specified by a block diagram using the symbols, and relieves the user from having to manually generate the specific implementation of the high level block diagram.

Steps in the Overall Flow of High-level Block Diagram Implementation

Figure 4:
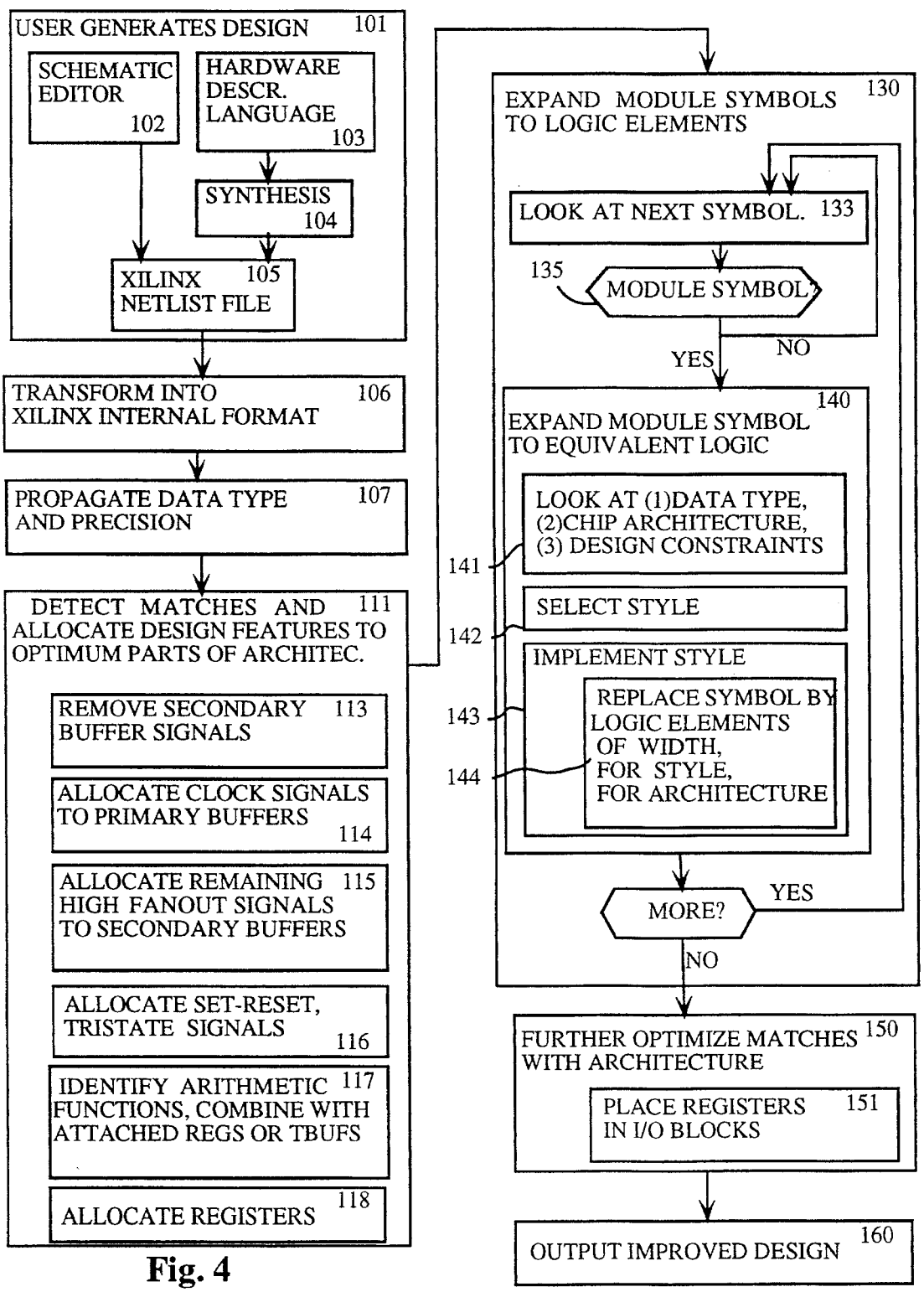
FIG. 4 shows a flow diagram for implementing a high-level block diagram in a logic array chip, of which the present invention is a part.
Figure 5:
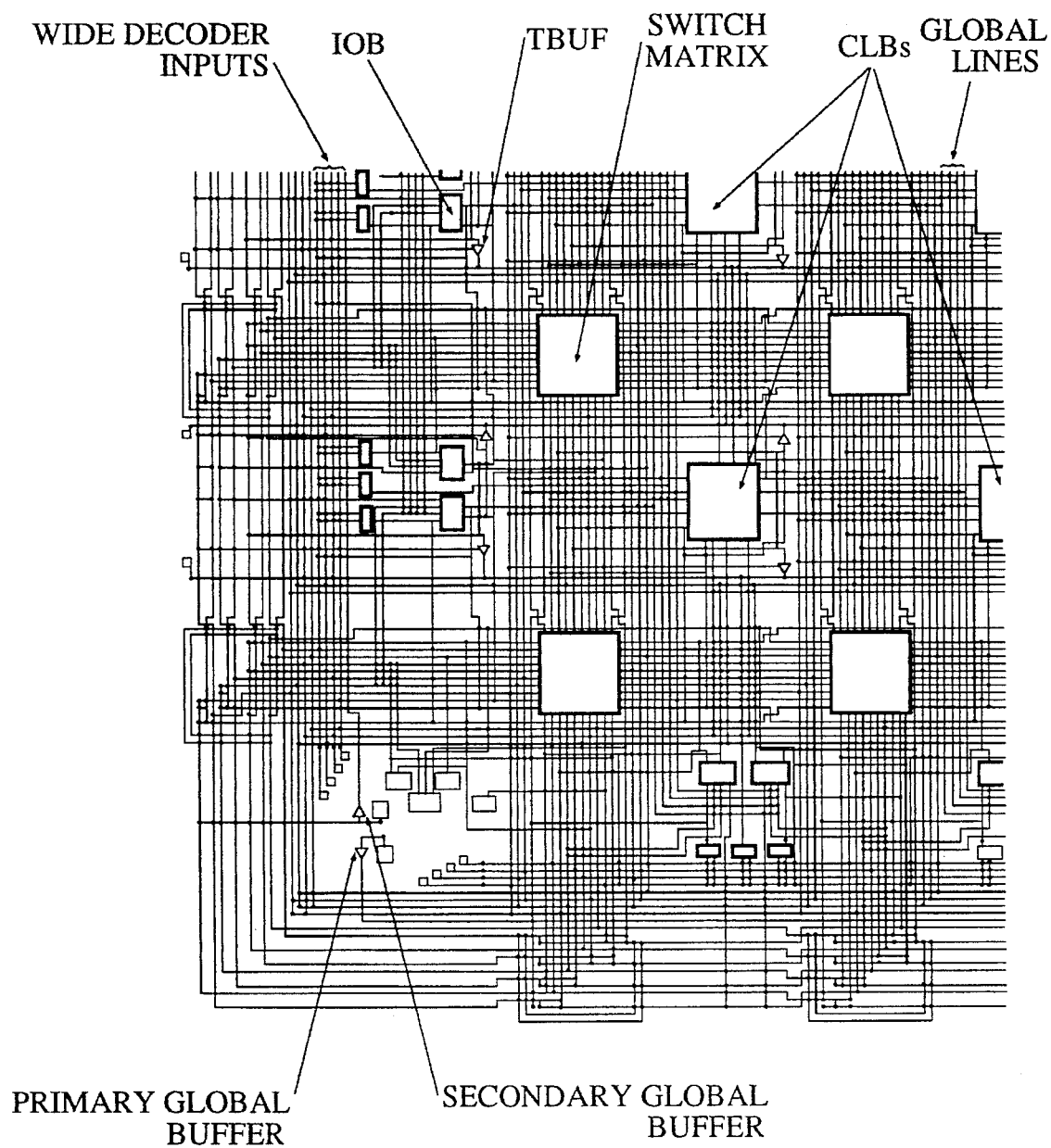
FIG. 5 shows a portion of a Xilinx XC4000-series logic array chip which can be configured to implement a high-level design.

FIG. 4 shows the steps for converting the user's design to a design which can be efficiently placed and routed into a field programmable gate array chip. The following steps are discussed in terms of a graphical description of a logic design. Similar steps are performed for a hardware description language representation of a logic design.

Figure 3:
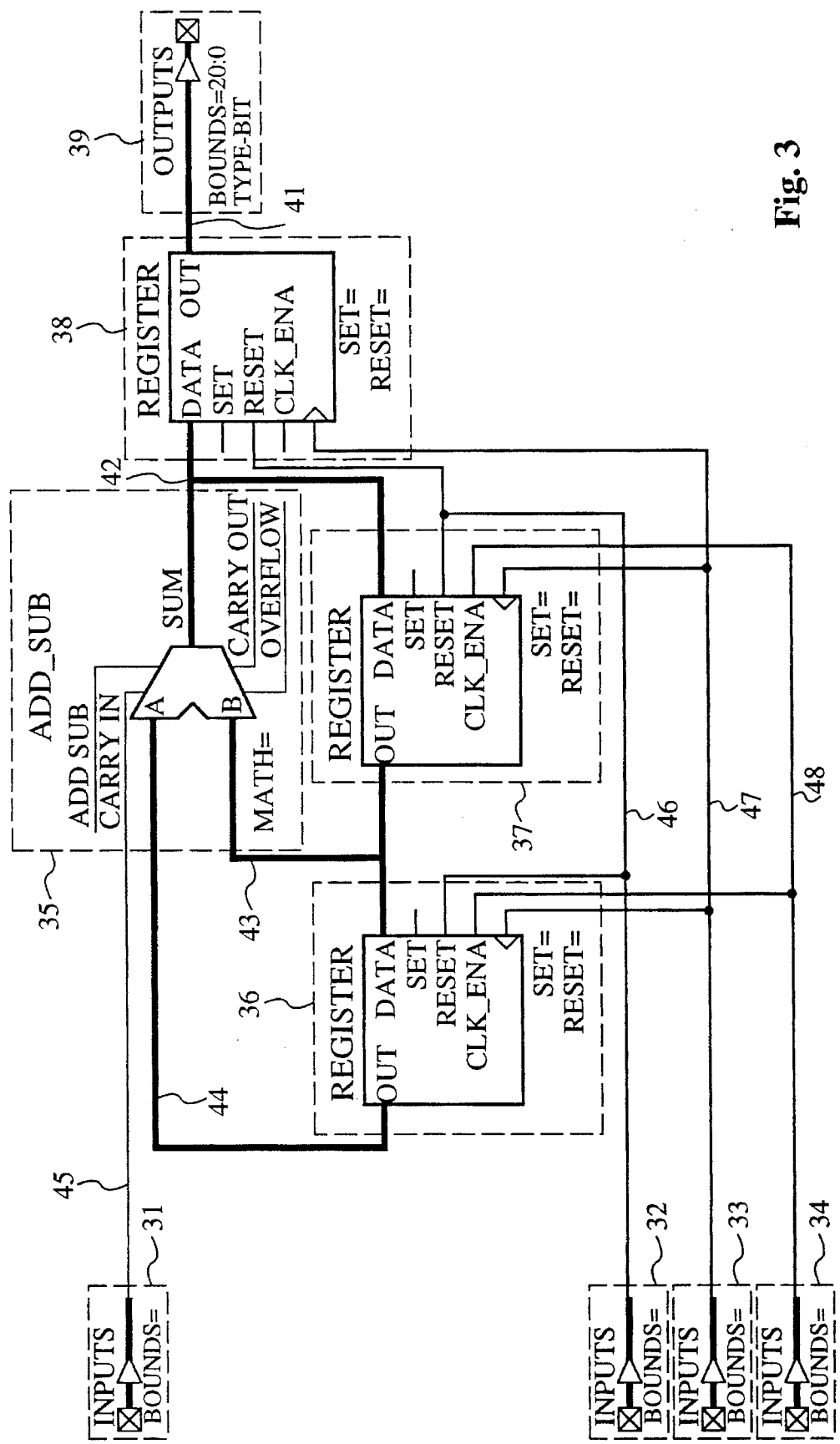
FIG. 3 shows an example computer screen representation with specific arithmetic functions.

In step 101, the user generates the logic design. The user may generate a design either as represented in step 102 by using symbols displayed on a computer monitor by a schematic editor, or as represented in step 103 by typing descriptions of the functional blocks to be used and their connections to each other. In step 104, the description is synthesized. In either method, the user must provide certain additional information including data type and precision of bus-wide functions. The design is preferably read and displayed to the user as each element of the design is entered. FIG. 3 shows such a computer screen representation. If the functions desired by the designer are supported by a high-level library symbol and corresponding master template for the function (set of instructions for interpreting the functional block symbol), the designer may represent that function by a simple block in the schematic diagram. A user may represent high-level functions not supported by a master template by primitive Boolean functions or flip flops such as shown in FIG. 2a. In step 105, the user's design is stored as a Xilinx netlist file, that is a file of functional elements, interconnections, data types, and other information which completely specify the design in a format which can be used in the steps to follow. (A netlist is a list of symbols and the lines which interconnect the symbols. It corresponds to the symbols and interconnections shown in the schematic diagram entered by the user.)

In step 106, the user's information is transformed into an internal format for representing the design. This XIF format information is referred to below as the graph of the circuit design. As each step in implementing the design is carried out, the program updates this graph. This XIF format is convenient for the operations which follow.

Data Type Propagation

As further described in related patent application Ser. No. 07/785,664 now U.S. Pat. No. 5,422,833, also assigned to Xilinx, Inc, entitled METHOD FOR PROPAGATING DATA TYPE IN A HIGH LEVEL BLOCK DIAGRAM, in step 107, the information provided by the user on data type and precision is propagated to all appropriate parts of the logic design, thereby saving the user from having to perform this step repetitively. Precision refers to the number of digits in an arithmetic quantity. If the data type is binary or hexadecimal or another type where one digit represents one bit, the precision is the same as the bus width. If the data type is BCD, each digit is represented by 4 bits and the bus width is 4 times the precision.

After data type propagation step 107 is complete, the method outlined in FIG. 4 proceeds with step 111, allocating design features to appropriate chip resources. This step is the subject of the present invention. In step 111, parts of the design are marked to be assigned to types of resources of the field programmable gate array chip which will implement the design. It is in this design feature allocation step that the requirements of the design are matched with the architectural characteristics of the physical chip to make more efficient use of the resources on the chip. A different chip architecture would need a different allocation of resources to implement the same design efficiently.

A preferred embodiment of the invention is used with Xilinx 4000-series chips. The steps performed in this preferred embodiment of the present invention to allocate design features to resources in the chip intended for those features include:

step 113 of removing secondary buffer signals which the user may have unwisely assigned, step 114 of allocating clock signals to primary buffers which feed only clock lines of flip flops, step 115 of allocating high fanout non-clock signals to secondary buffers which feed long lines that can connect to any port, step 116 of allocating set/reset signals to buffers and long lines that feed set and reset lines of flip flops only, and step 117 of identifying arithmetic functions and combining with attached registers and tristate buffers where possible step 118 for registers which are specified to connect to external pins, allocating these registers to input/output blocks on the periphery of the chip.

These first cut steps of allocating resources are explained in further detail below.

Before logic functions represented in the designer's block diagram can be placed in the logic array chip, the logic functions indicated in block diagram form are expanded to their full width. A function indicated by an adder symbol, for example, with a 16-bit output bus is replaced by 16 1-bit adders with carry functions interconnected to form the 16-bit adder. The 16-bit bus connected to it is replaced by 16 lines connecting to each of the 1-bit adders plus elements which connect the line to its place on the bus. If the bus connects to another function, say, a 16-bit register, the register is replaced by 16 1-bit flip flops. The connection from the register to the bus is replaced by 16 lines each with an element connecting the line to its place in the bus. U.S. patent application Ser. No. 08/268,884 filed concurrently herewith, entitled METHOD FOR GENERATING LOGIC MODULES FROM A HIGH LEVEL BLOCK DIAGRAM describes this portion of the logic flow.

Arithmetic functions, especially wide arithmetic functions, are expanded using hard macros. A hard macro specifies the implementation of a high-level function in a fixed bus width, with specified interconnections between logic blocks and specific configurations of each logic block which implements the function. A hard macro can not be subsequently modified. The performance is predictable, and optimized for implementing the specific function in the particular hardware. (Soft macros are also available in fixed bus widths, but they can be modified as to placement, and routing.)

Register functions, especially shift register functions, contain complex logic that can be expanded into a logic implementation or mapped into hard macros. The logic implementation allows subsequent optimization of the logic in CLBs while the hard macro fixes the entire contents of a CLB.

In step 130, the hard macro expands a high-level function to occupy a specific portion of the logic array chip (or several chips). The expanded logic circuit elements are recorded in a net list format in an XNF file. Arithmetic functions, especially wide arithmetic functions, may be marked during module generation to use the fast-carry feature if the logic of the method determines that a fast carry method will require less chip area or be faster than ripple carry.

An advantage of marking the functional blocks with attributes in step 111 before expanding the functional blocks to their bus-wide equivalents in step 130 is that bus-wide functions must only be evaluated and marked once, thus saving computer (and user) time which would be spent evaluating and marking every line on a bus.

Step 130 includes grouping certain block diagram symbols. For example in the Fibonacci generator of FIG. 3, register 38 and outputs block 39 are grouped to be implemented in input/output cells, thus freeing lines which would have been needed for bus 41 for other use, and freeing logic blocks which would have been needed for flip flops to implement register 38 for other use.

Because of this module expansion step 130, step 150 is included to achieve further matching of design features with the available resources in the chip architecture.

As a final step 160, the improved design, which includes functional blocks allocated to particular resources available in the chip architecture, is output in a file which can then be placed and routed to configure the logic array chip.

Special Arithmetic Symbols

Symbols for arithmetic operators will be replaced by a general symbol called ARITH. This symbol can be configured to represent the adder, register, tristate buffer functions within the single symbol. Since a hard macro must specify the entire contents of a CLB, it is not efficient to use a hard macro for a function which occupies only a small portion of a CLB. Currently, bit widths less than about 8 are not suited to hard macros. The most efficient implementation of arithmetic operators in hard macros combines any associated registers and three-state buffers in the hard macro where possible.

Arithmetic functions share a common logic structure. All add one value to another. For example, a counter calculates $$Q+1$$

where

Q is the output of a register and 1 is the value one represented in a particular number system.

An adder calculates $$A+B$$

where

A and B are two values represented in a particular number system.

An accumulator calculates $$Q+A$$

where

Q is the output of a register, and

A is a value represented in a particular number system. The performance (speed) and chip area required to implement the arithmetic functions in an electronic device are determined by the method used to create the carry chain within the circuit. The carry chain propagates the carry function to the next higher order bit of the number or arithmetic function.

In some device architectures, for example the Xilinx XC4000-series Field Programmable Gate Array (SC4000 FPGA), some logic functions can be included with the arithmetic function. For example, the arithmetic function may be followed by a register or a three-state buffer. Registers and three-state buffers are frequently combined with certain arithmetic functions. The register is combined with an adder to form an accumulator, and the three-state buffer is combined with an accumulator when placing an output value on a bus.

In the effort to combine arithmetic functions with registers or TBufs, the method of combining does not extend to functions which already include the function. For example, an accumulator and a counter, each of which includes a register, are not combined with another register.

General Arithmetic Function

As a novel feature of the present invention, a general arithmetic function is provided. By mapping a variety of arithmetic symbols into a common form, a single set of mapping algorithms can be applied to a wide set of functions. A function, which we call ARITH, can include all the features of the individual arithmetic symbols shown in FIGS. 2a–2f.

Figure 6:
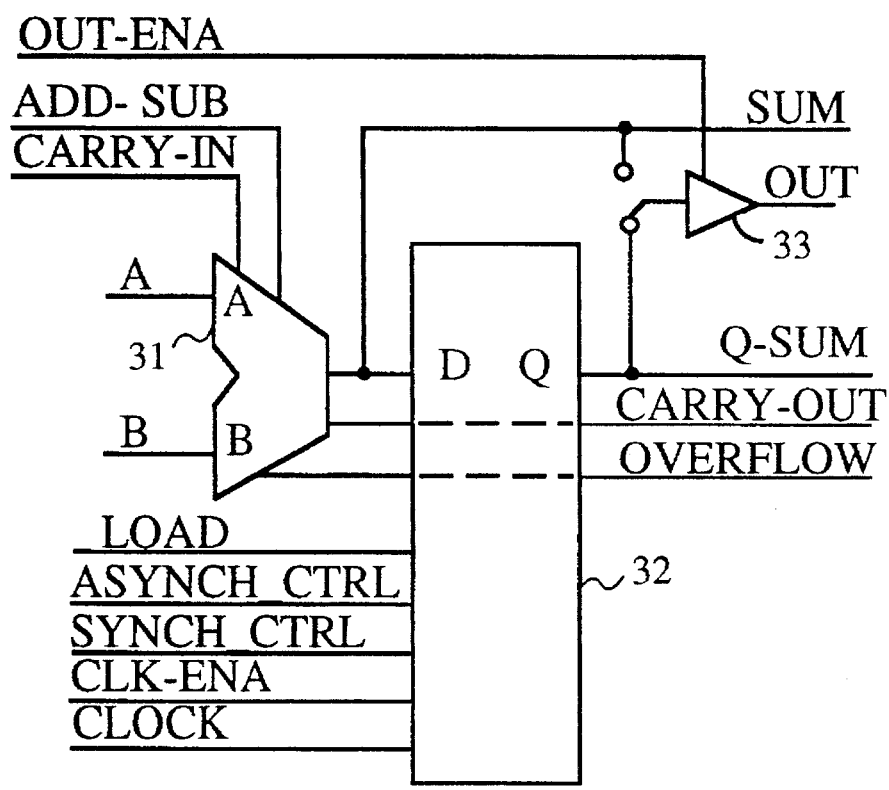
FIG. 6 shows a general arithmetic symbol which incorporates all the features of the individual elements of FIGS. 2a–2f.

FIG. 6 shows the symbol for this general ARITH function. Included in the symbol are the following pins:

| | |
|---|---|
| OUT_ENA | which enables the tristate output of the ARITH function. |
| ADD_SUB | which selects whether the arithmetic function will be addition or subtraction (including counting up or counting down). This pin can be dynamically controlled or tied high or low to select a steady-state function. |
| CARRY_IN | This is the carry-in input to the least significant bit. |
| A | One of the arithmetic data inputs. For a counter, this value can be set to "1" (tied high). |
| B | The other arithmetic data input. For counters and accumulators, the B input is connected to the output of a register which receives input from the adder part of the ARITH symbol. |
| LOAD | Loads the value output by the adder-subtractor into the data input of the register. |
| ASYNCH-CTRL | Forces asynchronous reset of the register to the value specified in the asynch_val parameter on the register symbol. If unconnected, the global set-reset line will be used. |
| SYNCH-CTRL | Forces the register to the value specified in the synch_val parameter at the next clock pulse. |
| CLK_ENA | Clock enable input. |
| CLOCK | Clock input. |
| SUM | Sum output from adder. Also provides the D input to register 32, and may be connected to |

-continued

| | |
|---|---|
| | the input terminal of three-state buffer 33. |
| OUT | Output from three-state buffer 33. |
| Q_SUM | Registered value of SUM. |
| CARRY_OUT | Carry output. |
| OVERFLOW | Overflow output. Used for 2's complement arithmetic and to indicate when the sum of the inputs exceeds the bitwidth of the adder. |
| STYLE= | Attribute to be entered by user or determined by an expert system to specify how the ARITH symbol is implemented. |
| ASYNCH-VAL= | Attribute that specifies the value to be loaded into the register when the asynchronous control signal is active. |
| SYNCH-VAL = | Attribute that specifies the value to be loaded into the VAL register when the synchronous control signal is active. |

FIG. 9 shows how the ARITH function is configured to implement six commonly used arithmetic functions. Regarding Table I, and as can be seen from the ARITH function symbol, the SUM output is available as both unregistered output on the SUM output, registered output on the Q_SUM output, and three-statable registered output on line OUT from TBuf 33. Note that the TBuf output may come from either the unregistered SUM or the registered Q_SUM outputs. Note also, that the CARRY_OUT and OVERFLOW outputs may be used for some of the data types indicated by the STYLE=value.

Special Register Symbols

Like arithmetic functions, register functions have a common logic structure. Each register is implemented using a several set or reset flip flops, and has clock and clock enable inputs. The input to the flip flop (whether D, SR, T, JK or other style) may have one, two, or more signals which combine to determine the next state of the flip flop. Rather than specify this related logic separately, it is included as an option on the SHIFT register symbol. When a user calls these related functions, the program implements the related functions along with the register function in a way that is efficient for the particular chip architecture. Hard macros are provided which include the related functions, all implemented in an efficient way. This is an improvement over mapping an isolated register in a way which does not easily allow for additional related logic. In one preferred embodiment, the register is implemented as a set of logic gates that can be efficiently placed in a CLB. The parameters associated with the shift register symbols allow a designer to specify values to be synchronously or asynchronously placed in the register. The user may also specify a style for the shift. The preferred style implementation allows circular shift, logical shift and arithmetic shift in addition to shifting in an outside value serially or in parallel.

Signals may also beneficially be combined. Some of the signal groups which might be combined are:

LOAD & DATA to form a basic data register or parallel load register. LEFT-IN, RIGHT-IN, and LEFT/RIGHT CONTROL controls direction of serial input. The left right control can be tied to a constant value to provide shifting in only one direction. It may also be tied to a signal whose polarity will control the direciton of the shift.

General Register Function

As another novel feature of the present invention, a general register function is provided. By mapping a variety of register functions into a common form, a single set of mapping algorithms can be applied to a wide range of register functions. A symbol called SHIFT can include all the features of the individual register symbols shown in FIGS. 7a–7d.

Figure 8:
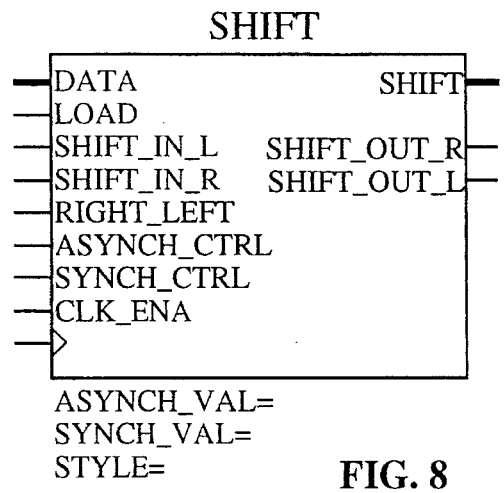
FIG. 8 shows a general high level register symbol that incorporates all the features of the individual elements shown in FIG. 7.

FIG. 8 shows the general SHIFT symbol. Included in the symbol are the following pins:

| | |
|---|---|
| DATA | represents a parallel data input port. |
| LOAD | enables parallel loading from the DATA port and disables the right-left shift. |
| SHIFT_IN_L | connects to the most significant bit of the register. |
| SHIFT_IN_R | connects to the least significant bit of the register. |
| RIGHT_LEFT | controls the serial mode register direction |
| ASYNCH_CTRL | forces the register asynchronously to a value specified by the asynch_val parameter |
| SYNCH_CTRL | forces the register to the values specified by the synch_val, at the next clock cycle and can be used to override other flip flop inputs. |
| CLK_ENA | can be used to enable or disable the clock, thus controlling when the next state of the register is loaded. |
| CLOCK | clock input |
| SHIFT | provides parallel data output |
| SHIFT_OUT_L | provides serial output from the MSB |
| SHIFT_OUT_R | provides serial output from the LSB |

EXAMPLES

In the Xilinx BLOX synthesis package, the ARITH symbol is used to optimally map arithmetic functions into XC4000 FPGAs. Within the XC4000 FPGA, there is an array of logic functions called configurable logic blocks (CLBs). Structure of these configurable blocks is described in the Xilinx Data book mentioned above. Within each CLB is a dedicated carry logic circuit that provides speed close to that of a carry-lookahead algorithm. Yet this dedicated carry circuit achieves its speed with a small fraction of the logic used in a carry-lookahead circuit. Indeed the chip area is about as small as the much slower ripple carry algorithm. Also included in the Xilinx XC4000-series chips are three-state buffers adjacent to each CLB.

To take advantage of this fast carry circuit in the Xilinx XC4000-series chips, the present software recognizes high level blocks such as shown in FIGS. 2a–2f and creates a correspondingly configured ARITH function. Preferably, the software can recognize when the adder is followed by a register that can be included in the ARITH configuration so that the register in the same CLB as the adder can be utilized. Preferably, the software can also recognize a three-state buffer which is driven by an adder or register, and includes the three-state function in the ARITH configuration so that it can be implemented by a three-state buffer adjacent to a CLB. Implementations of each of the functions available in the BLOX package has been optimized for the hardware of these XC4000-series chips. This optimized implementation includes optimized partitioning and placement of the function.

Importantly, since the fast carry circuit of the Xilinx XC4000-series chips is used with all ARITH functions, only a single implementation of the fast carry logic is needed to implement carry portions of all the arithmetic functions. This ARITH function makes diverse functions easily available to the user, and implements the user's functions with speed and in a compact silicon area.

In the Xilinx BLOX synthesis package, the SHIFT symbol is used to map register functions into XC4000 FPGAs. Both of these general functions (ARITH and SHIFT) free the designer from worrying about implementation detail.

When the functions are implemented, the user's logic can be efficiently and unambiguously implemented.

We claim:

1. A computer-aided method for implementing functions of a logic design comprising the steps of:
   storing a general function component which includes a general arithmetic component and a general register component; and
   configuring said general function component to implement a specific function component selected by a user, wherein said specific function component provides either an arithmetic function or a register function.

2. The method of claim 1 wherein said specific function component includes an adder.

3. The method of claim 1 wherein said specific function component includes a comparator.

4. The method of claim 1 wherein said specific function component includes a shift register.

5. The method of claim 1 wherein said specific function component includes an accumulator.

6. The method of claim 1 wherein said specific function component includes a counter.

7. The method of claim 1 wherein said specific function component includes a data register.

8. The method of claim 7 wherein said data register includes an asynchronous control means.

9. The method of claim 7 wherein said data register includes a synchronous control means.

10. The method of claim 4 wherein said data register includes an asynchronous control means.

11. The method of claim 4 wherein said data register includes a synchronous control means.

12. The method of claim 1 wherein said general function component is a general arithmetic function component and said plurality of specific function components includes a tri-state buffer.

13. The method of claim 1 further including the step of providing data type and precision information.

14. The method of claim 13 wherein said step of providing includes propagating said data type and precision information to another part of said logic design.

15. A method of allocating design features to appropriate chip resources comprising the steps of:
   identifying a specific component as an arithmetic component; and
   mapping said specific component to a general arithmetic component.

16. The method of claim 15 further including the step of allocating clock signals to primary buffers as part of said chip resources.

17. The method of claim 15 further including the step of allocating clock signals to secondary buffers as part of said chip resources.

18. The method of claim 15 further including the step of allocating clock signals to primary and secondary buffers as part of said chip resources.

19. The method of claim 15 further including the step of removing redundant buses.

20. The method of claim 15 further including the step of removing predetermined secondary buffer signals assigned by a user.

21. The method of claim 15 further including the step of splitting candidate signals into their clock and logic connection components.

22. The method of claim 15 further including the step of allocating high fan-out signals to primary buffers as part of said chip resources.

23. The method of claim 15 further including the step of allocating high fan-out, non-clock signals to secondary buffers as part of said chip resources.

24. The method of claim 15 further including the step of allocating high fan-out signals to primary and secondary buffers as part of said chip resources.

25. The method of claim 15 further including the step of allocating set signals or reset signals to buffers.

26. The method of claim 15 further including the step of allocating registers to input blocks or output blocks after said step of mapping.

27. A method of allocating design features to appropriate chip resources comprising the steps of:
   identifying a specific component as a register-type component; and
   mapping said specific component to a general register component.

28. The method of claim 27 further including the step of allocating clock signals to primary buffers as part of said chip resources.

29. The method of claim 27 further including the step of allocating clock signals to secondary buffers as part of said chip resources.

30. The method of claim 27 further including the step of allocating clock signals to primary and secondary buffers as part of said chip resources.

31. The method of claim 27 further including the step of removing redundant buses.

32. The method of claim 27 further including the step of removing predetermined secondary buffer signals assigned by a user.

33. The method of claim 27 further including the step of splitting candidate signals into their clock and logic connection components.

34. The method of claim 27 further including the step of allocating high fan-out signals to primary buffers as part of said chip resources.

35. The method of claim 27 further including the step of allocating high fan-out non-clock signals to secondary buffers as part of said chip resources.

36. The method of claim 27 further including the step of allocating high fan-out signals to primary and secondary buffers as part of said chip resources.

37. The method of claim 27 further including the step of allocating set signals or reset signals to buffers.

38. The method of claim 27 further including the step of allocating registers to input blocks or output blocks after said step of mapping.

* * * * *